US008665419B2

(12) United States Patent
Pnini-Mittler

(10) Patent No.: US 8,665,419 B2
(45) Date of Patent: Mar. 4, 2014

(54) DEVICE FOR AN OPTICAL ARRANGEMENT AND METHOD FOR POSITIONING AN OPTICAL ELEMENT OF AN OPTICAL ARRANGEMENT

(75) Inventor: Boaz Pnini-Mittler, Heuchlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 163 days.

(21) Appl. No.: 13/102,496

(22) Filed: May 6, 2011

(65) Prior Publication Data

US 2011/0279802 A1 Nov. 17, 2011

(30) Foreign Application Priority Data

May 12, 2010 (DE) .......................... 10 2010 028 941

(51) Int. Cl.
*G03B 27/54* (2006.01)
*G03B 27/42* (2006.01)

(52) U.S. Cl.
USPC .............................................. 355/67; 355/53

(58) Field of Classification Search
USPC ....................... 355/67, 53; 359/811
See application file for complete search history.

(56) References Cited

U.S. PATENT DOCUMENTS

| 5,822,133 | A | * | 10/1998 | Mizuno et al. | 359/696 |
| 5,852,518 | A | * | 12/1998 | Hatasawa et al. | 359/822 |
| 6,307,688 | B1 | * | 10/2001 | Merz et al. | 359/819 |
| 2002/0163741 | A1 | * | 11/2002 | Shibazaki | 359/819 |
| 2003/0162484 | A1 | | 8/2003 | Oshino | |
| 2005/0078386 | A1 | * | 4/2005 | Takabayashi | 359/819 |
| 2006/0066963 | A1 | | 3/2006 | Sudoh | |
| 2007/0076184 | A1 | * | 4/2007 | Kwan et al. | 355/67 |
| 2007/0177282 | A1 | | 8/2007 | Makino et al. | |
| 2008/0144199 | A1 | * | 6/2008 | Schoeppach et al. | 359/824 |
| 2008/0225225 | A1 | | 9/2008 | Umeda | |
| 2008/0225255 | A1 | * | 9/2008 | Margeson et al. | 355/67 |
| 2010/0033770 | A1 | | 2/2010 | Hongo | |
| 2010/0157270 | A1 | * | 6/2010 | Muehlbeyer et al. | 355/67 |

FOREIGN PATENT DOCUMENTS

| DE | 10 2008 044 365 | 6/2009 |
| EP | 1 338 911 A2 | 8/2003 |
| JP | 27-009345 | 10/1952 |
| JP | 2004-062091 | 2/2004 |
| JP | 2004-078209 | 3/2004 |

OTHER PUBLICATIONS

English translation of German Office Action for corresponding DE Appl No. 10 2010 028 941.8, dated Feb. 23, 2011.
Japanese Office Action, with translation thereof, for corresponding JP Appl No. 2011-106664, dated May 14, 2013.

* cited by examiner

*Primary Examiner* — Peter B Kim
*Assistant Examiner* — Deoram Persaud
(74) *Attorney, Agent, or Firm* — Fish & Richardson P.C.

(57) ABSTRACT

A device for an optical arrangement includes an optical element and a holding structure. The optical element makes contact with the holding structure at six discrete contact points. Coupling elements are provided, by which it is possible to apply a force at the contact points. A component of the force is greater than the weight force of the optical element in terms of absolute value and/or direction.

34 Claims, 4 Drawing Sheets

United States Patent US 8,665,419 B2

DEVICE FOR AN OPTICAL ARRANGEMENT AND METHOD FOR POSITIONING AN OPTICAL ELEMENT OF AN OPTICAL ARRANGEMENT

CROSS-REFERENCE TO RELATED APPLICATION

This application claims benefit under 35 U.S.C. §119 of German patent application number 10 2010 028 941.8, filed on May 12, 2010, the entire contents of which are hereby incorporated by reference.

FIELD

The disclosure relates to a device for an optical arrangement which includes an optical element and a holding structure, and more particularly to such a device for a microlithography projection exposure apparatus. Furthermore, the disclosure relates to a method for positioning an optical element of an optical arrangement.

BACKGROUND

To obtain high imaging quality, particularly in microlithography, it is desirable to position optical elements (e.g., lenses, mirrors or gratings) with high precision and in a highly reproducible fashion.

As used to herein, the terms "kinematically determined holding device" and "kinematic holding device" refer to a holding device for mounting an element such that no rigid-body movements are possible, where each rigid-body movement is eliminated by only one mechanism or one constraint.

A kinematically determined holding device for an optical element is known, for example, from U.S. 2007/0177282. The holding device in U.S. 2007/0177282 A1 includes three prism-type holding arms connected to the optical element. Each holding arm is mounted in a V-shaped receptacle structure via rolling bodies.

SUMMARY

The disclosure provides a device which includes an optical element and a holding structure. The optical element can be positioned in the holding structure with high accuracy and good reproducibility. The disclosure also provides a method for accurately and reproducibly positioning an optical element of an optical arrangement.

The disclosure provides a device for an optical arrangement. The optical arrangement includes an optical element and a holding structure for supporting the optical element. The optical element makes contact with the holding structure at six discrete contact points. Coupling elements apply a force at the contact points. A component of the force is greater than the weight force of the optical element in terms of absolute value and/or direction.

The disclosure also provides a method for positioning an optical element. The method include displacing at least one contact point for a support of an optical element in a holding structure.

The term contact points denotes in this context substantially punctiform contact locations between two bodies with a curved surface. On account of flattened portions, the bodies in this case make contact with one another not only at a point, but rather areally. By way of example, two crossed circular cylinders make contact with one another in a contact ellipse. The position of the six contact points is chosen such that the contact points enable a reproducible and precise support of the optical element on the holding structure. In advantageous configurations, the contact points are distributed in pairs over the circumference of the optical element.

The coupling elements are configured so that the optical element can be fixed on the holding structure in the position defined by the contact points by applying a definable force. In advantageous configurations, the coupling elements are configured as clamping and/or force-generating units.

In some embodiments, the optical element has three connecting pins projecting substantially in a radial direction. The connecting pins each make contact with the holding structure at two contact points. The connecting pins are fixedly connected to the optical element. In advantageous configurations, the connecting pins are distributed uniformly over the circumference of the optical element. The two contact points are preferably chosen such that forces acting at the contact points are orthogonal to one another. In advantageous configurations, the connecting pin has a right-cylindrical region at which the connecting pin makes contact with the holding structure.

In certain embodiments, the connecting pins each have an oval, such as an elliptical or a circular, cross section. A contact area can be enlarged by an elliptical cross section, such that mechanical stresses that occur are reduced.

In some embodiments, each connecting pin is supported on the holding structure by a bearing pin pair including two bearing pins, such as two bearing pins arranged substantially orthogonally to one another. Each bearing pin has a right-cylindrical contact section which makes contact with the associated connecting pin. The associated connecting pin crosses the bearing pins and is arranged orthogonally to the bearing pins in an advantageous configuration. If two crossed cylindrical bodies are pressed against one another, then they make contact with one another only in a punctiform manner in the idealized case. The connecting pins and the bearing pins are designated in combination as pins. Consequently, the optical element is supported by nine pins.

In certain embodiments, the connecting pins are coupled to the bearing pins by the coupling elements, such that rigid-body movements of the optical element are prevented on account of constrained bonds. A coupling of the connecting pin to the bearing pins for a fixing can be realized in a suitable manner.

In some embodiments, the coupling elements include clamping units, by which each connecting pin is mechanically coupled to the associated bearing pin pair. In one configuration, the clamping units are embodied in the manner of a scaffolding coupling.

Alternatively or additionally, the coupling elements include force-generating elements, such as magnets. In this case, the can be configured at least partly as magnetic pins wherein a force can be applied by the magnetic pins.

In certain embodiments, the bearing pins have a tapered pin end. The tapered pin end can have a taper angle with a taper ratio $(D-d)/L=1:50$, with a smaller diameter d at the free end of the bearing pin end, a larger diameter D at an end facing the contact section, and a length L of the tapered pin end. The tapered pin end ensures a reproducible positioning of the bearing pins, more precisely of an axis of the bearing pins, in the holding structure.

In some embodiments, the bearing pins are arranged in exchangeable fashion on the holding structure. The bearing pins are fitted on the holding structure by screw connections, for example. In this case, in advantageous configurations, the bearing pins are introduced by their tapered pin ends into corresponding cutouts on the holding structure. In this case, in advantageous embodiments, a multiplicity of bearing pins having different diameters of the contact section is provided. By choosing a bearing pin, it is thus possible to define a contact point for the optical element in a reproducible manner.

In advantageous embodiments it is provided that, for altering the position of the optical element, at least one bearing pin for supporting the optical element is exchanged for a bearing pin having a deviating diameter. For the purpose of positioning the optical element, the latter is firstly arranged on the holding structure and its position with respect to the holding structure is detected. If the actual position of the optical element relative to the holding structure deviates from a desired position, then supporting locations for the optical element can be altered by exchanging the bearing pins for an exact positioning. For this purpose, in advantageous embodiments, different bearing pins are made available, which differ in a diameter in a contact region. The bearing pins can be produced with high precision, such that, for example, the diameter of two bearing pins differs even only in the range of a few micrometers.

The above and further features emerge not only from the claims but also from the description and the drawings, wherein the individual features can be realized in each case by themselves or as a plurality in the form of subcombinations in embodiments of the disclosure and in other areas and can constitute advantageous and inherently protectable embodiments. In the drawings, uniform reference symbols are used for identical or similar component parts.

DETAILED DESCRIPTION

Figure 1:
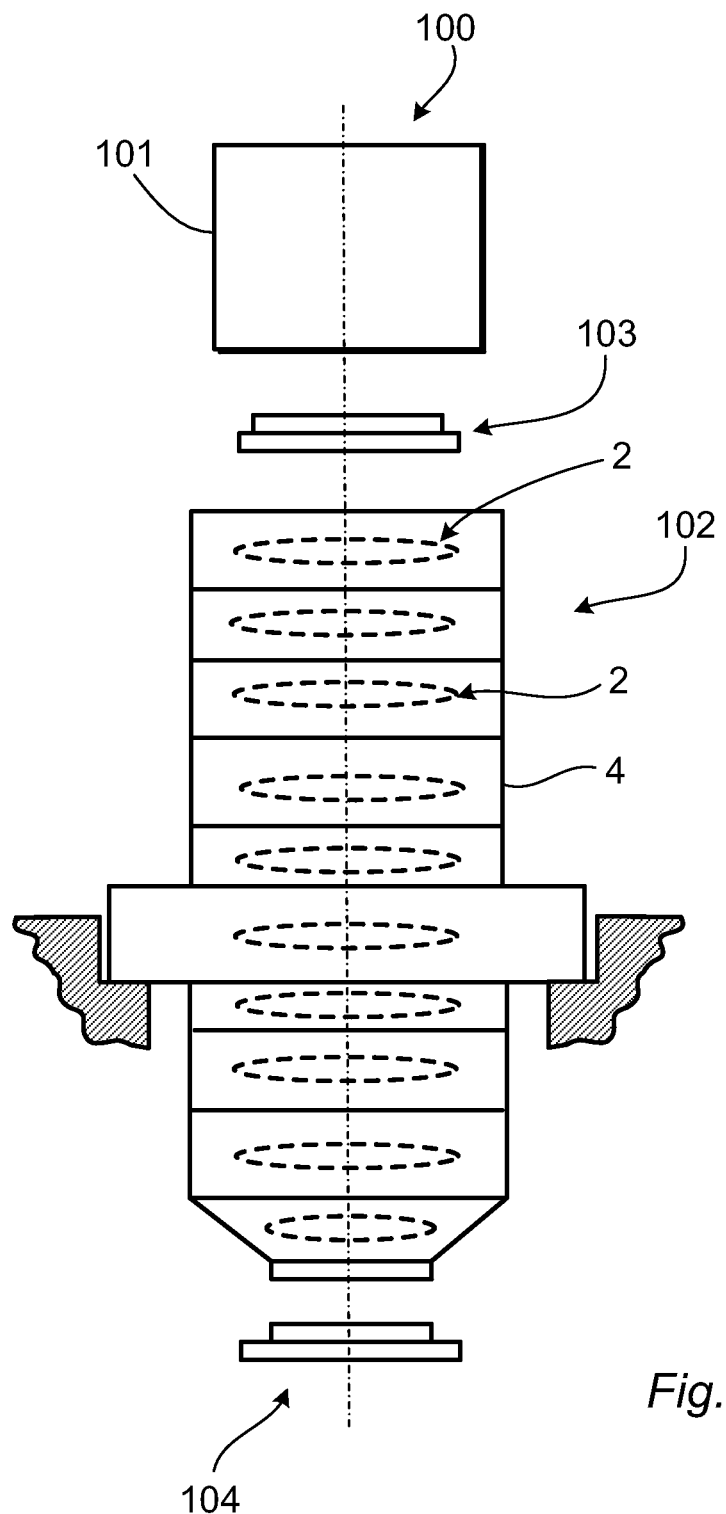
FIG. 1 schematically shows a microlithography projection exposure apparatus with a device according to the disclosure.

FIG. 1 schematically shows a microlithography projection exposure apparatus 100. The microlithography projection exposure apparatus 100 includes an illumination unit 101, which generates an illumination radiation, and a projection objective 102. A mask 103 having a pattern is arranged between the projection objective 102 and the illumination unit 101. The pattern of the mask 103 is projected onto a substrate 104 arranged below the projection objective 102. The projection objective 102 includes various optical elements 2, such as lenses, mirrors, gratings or the like. The optical elements 2 are each supported on a holding structure 4 in a suitable manner.

Figure 2:
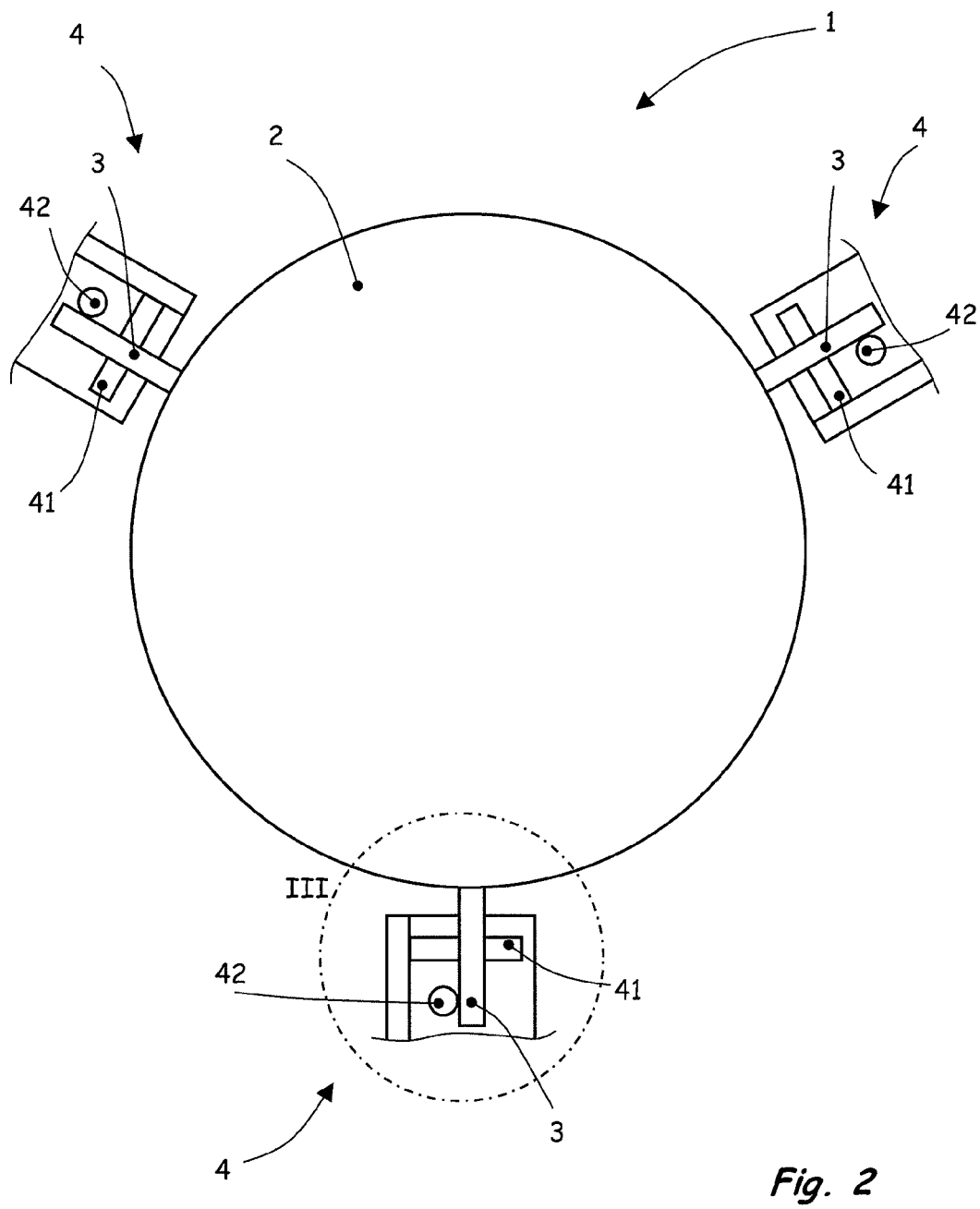
FIG. 2 schematically shows a device according to the disclosure.

FIG. 2 schematically shows a device 1 for an optical arrangement, for example a microlithography projection exposure apparatus 100 in accordance with FIG. 1. The device 1 includes an optical element 2 and a holding structure 4, three regions of which are visible.

In order to support the optical element 2 on the holding structure 4, three connecting pins 3, which substantially project in a radial direction, are fixedly connected to the optical element 2. In the exemplary embodiment illustrated, the connecting pins 3 are distributed substantially uniformly over the circumference and form angles of approximately 120° with one another. The holding structure 4 includes six bearing pins 41, 42. Each connecting pin 3 is supported by two bearing pins 41, 42. The connecting pins 3 and the bearing pins 41, 42 are designated in combination as pins or bolts, such that the device 1 can also be designated as a "9-pin device" or "9-bolt device". The pins 3, 41, 42 each have a right-cylindrical contact region in which they make contact with one another.

On account of the crossed arrangement and the cylindrical configuration, the bearing pins 41, 42 make contact with the associated connecting pin 3 in each case in a substantially punctiform contact area. In the device 1, therefore, the optical element 2 is thus supported at six discrete contact points. The connecting pins 3 and the bearing pins 41, 42 are fixed relative to one another by coupling elements (not illustrated in FIG. 2).

Figure 3:
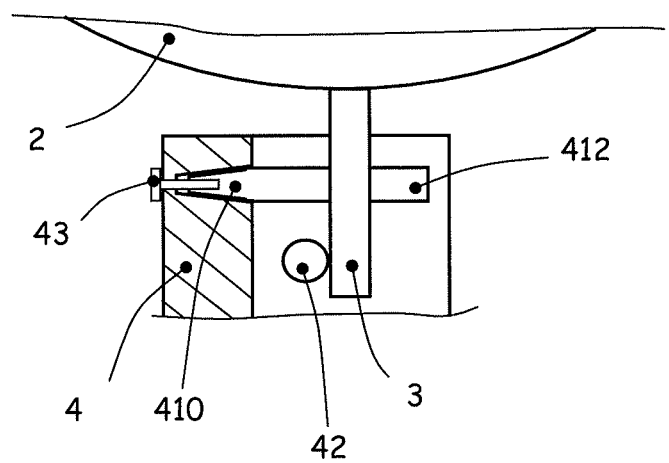
FIG. 3 schematically shows a detail III of the device in accordance with FIG. 2, FIGS. 4a-4c different bearing pins for a device according to the disclosure in accordance with FIG. 2, and FIG. 5 schematically shows a detail III of the device in accordance with FIG. 2 in a perspective illustration with a clamping unit.

FIG. 3 shows a detail III in accordance with FIG. 2. As can be discerned in FIG. 3, the bearing pins 41 are fixed in the holding structure 4 in an exchangeable manner. The bearing pins 41 have a tapered pin end 410. Contact is made with the connecting pin 3 in a substantially circular-cylindrical contact section 412. The fixing of the bearing pin 41 in the holding structure 4 is effected by a screw connection 43 in the embodiment illustrated. The tapered pin end 410 ensures that the bearing pin 41 is positioned in the holding structure 4 without play in a repeatable manner with regard to its axial direction and with a high precision. The bearing pin 42 is embodied analogously.

For the purpose of precisely positioning the optical element 2 relative to the holding structure 4, the optical element 2 is firstly placed onto the bearing pins 41, 42 at the holding structure 4. A position of the optical element 2 relative to the holding structure 4 is subsequently detected by a suitable measuring unit and/or a suitable measuring method. A contact point between the connecting pin 3 and the bearing pins 41, 42 is dependent on a diameter of the bearing pins 41, 42. If an actual position of the optical element 2 deviates from a desired position, then it is possible, for the purpose of orienting the optical element 2 relative to the holding structure 4, to alter a contact point by exchanging the bearing pins 41, 42. In this case, at least one bearing pin 41, 42 having a deviating diameter is used. On account of the altered diameter, the contact points are displaced. As a result of the contact points being displaced, an orientation of the optical element 2 relative to the holding structure 4 is thus altered.

For this purpose, a multiplicity of bearing pins 41, 42 are preferably provided according to the disclosure. By selecting and fitting suitable bearing pins 41, 42 on the holding structure 4, it is then possible to position the optical element 2 exactly with respect to the holding structure 4.

Figure 4:
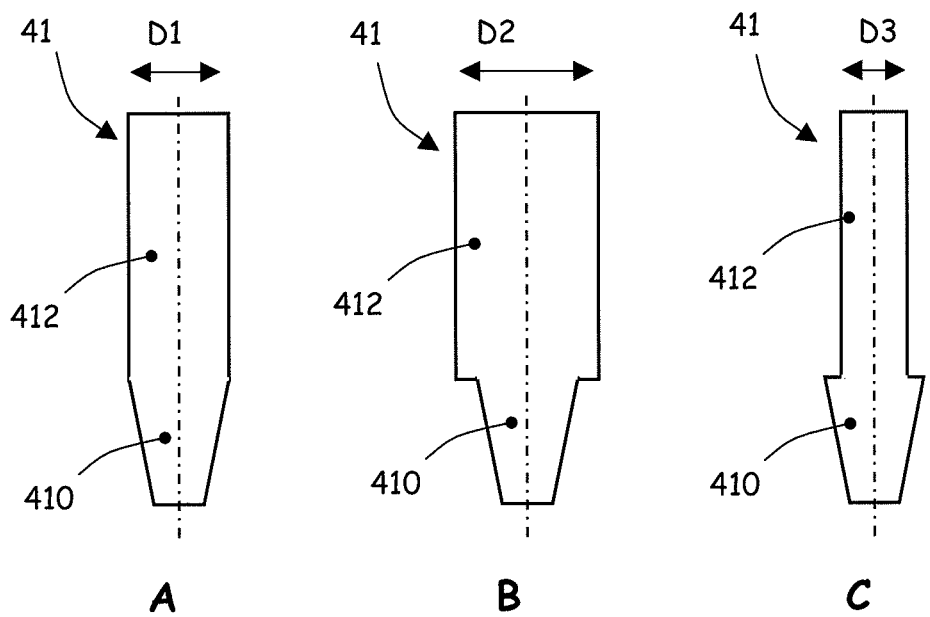

FIGS. 4a-4c schematically shows three different bearing pins 41. The bearing pins 41 each have a tapered pin end 410. A taper angle of the tapered pin end 410 is chosen, for example, such that a taper ratio of 1:50 is present. The bearing pins each have a circular-cylindrical contact section 412 adjoining the tapered pin end 410. In the exemplary embodiment in accordance with FIG. 4A, a diameter D1 of the circular-cylindrical contact section 412 corresponds to a maximum diameter of the tapered pin end 410. In the case of the embodiment in accordance with FIG. 4B, a diameter D2 of the circular-cylindrical region 412 is greater than a maximum diameter of the tapered pin end 410. In the case of the exemplary embodiment in accordance with FIG. 4C, by contrast, a diameter D3 is less than a maximum diameter of the tapered pin end 410. The bearing pins 41 in accordance with FIGS. 4a-4c are only three possible embodiments. In order to position the optical element exactly, it is desirable to provide bearing pins having a high accuracy and in a multiplicity of diameters. By selecting and fitting a suitable bearing pin 41 it is possible in this case to position the optical element 2 exactly and repeatably.

The connecting pins 3 in accordance with FIG. 2 bear on the bearing pins 41, 42 in each case at substantially punctiform contact points. A Hertzian stress occurs at these contact points. In one advantageous configuration, the connecting pins 3 are chosen such that they have an elliptical cross section. As a result of the configuration of the connecting pins 3 with an elliptical cross section, a contact area with respect to the bearing pins 41, 42 is enlarged. The forces at the contact points are reduced as a result. Moreover, the connecting pins 3 and the bearing pins 41, 42 are preferably composed of a suitable material having a high strength, for example composed of tungsten carbide.

Figure 5:
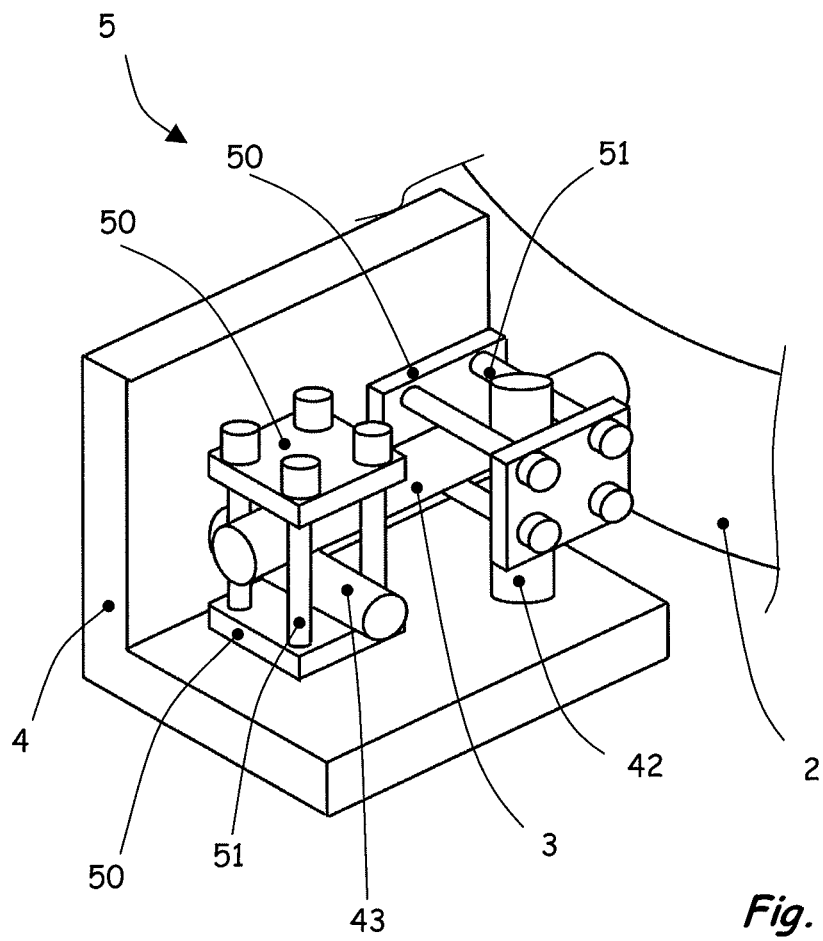

FIG. 5 shows a detail III in accordance with FIG. 2, wherein coupling elements by which a force can be applied at the contact points are illustrated. In the exemplary embodiment in accordance with FIG. 5, the coupling elements are configured as a clamping unit 5, by which a connecting pin 3 is connected to the associated bearing pin pair 41, 42 in a mechanically clamping manner. The clamping unit 5 illustrated schematically includes supporting elements 50 bearing on the connecting pin 3 and respectively on the bearing pins 41, 42, and tensioning elements 51 connecting the supporting elements 50 to one another. Via a tensioning force of the tensioning elements 51, forces can be applied at the contact points of the connecting pin 3 with the bearing pin 41 and respectively with the bearing pin 42. The forces each have a force component going beyond the weight force of the optical element 2 in magnitude and/or direction.

Alternatively or additionally it is conceivable for the pins 3, 41, 42 to be embodied at least partly in magnetic fashion, such that a magnetic force acting at the contact points supports or replaces the force applied by the clamping unit 5.

What is claimed is:

1. A device, comprising:
    an optical element comprising three connecting pins, each connecting pin substantially projecting in a radial direction and having a surface; and
    a holding structure supporting the optical element, the holding structure comprising six bearing pins which define three bearing pin pairs, each bearing pin pair comprising a first bearing pin with a longitudinal axis and a second bearing pin with a longitudinal axis which is non-parallel to the longitudinal axis of the first bearing pin, each bearing pin having a surface that extends along its longitudinal axis, each bearing pin being removably disposed within the holding structure,
    wherein:
        each connecting pin has a corresponding bearing pin pair;
        the surface of each connecting pin contacts the surface of each of the bearing pins in its corresponding bearing pin pair; and
        for a given connecting pin, a contact point between the surface of the connecting pin and the surface of the first bearing pin in its corresponding bearing pin pair is different from a contact point between the surface of the connecting pin and the surface of the second bearing pin in its corresponding bearing pin pair.

2. The device of claim 1, wherein each connecting pin has an oval cross-section.

3. The device of claim 1, wherein each connecting pin has an elliptical cross-section.

4. The device of claim 1, wherein each connecting pin has a circular cross section.

5. The device of claim 1, wherein, for each bearing pin pair, the longitudinal axis of the first bearing pin is substantially orthogonal to the longitudinal axis of the second bearing pin.

6. The device of claim 5, wherein each of the three connecting pins is substantially orthogonal to the longitudinal axis of the first bearing pin in its bearing pin pair and substantially orthogonal to the longitudinal axis of the second bearing pin in its bearing pin pair.

7. The device of claim 1, wherein each bearing pin has a tapered end.

8. The device of claim 1, wherein each bearing pin has a tapered end having a taper ratio of 1:50.

9. The device of claim 1, wherein the coupling elements comprise force-generating elements.

10. The device of claim 1, wherein the coupling elements comprise magnets.

11. An apparatus, comprising:
    a device according to claim 1,
    wherein the apparatus is a microlithography projection exposure apparatus.

12. The apparatus of claim 11, wherein the apparatus comprises an illumination unit and a projection objective, and the projection objective comprises the device.

13. An objective, comprising:
    a device according to claim 1,
    wherein the objective is a microlithography projection objective.

14. A method, comprising:
    providing a device according to claim 1; and
    displacing at least one contact point to position the optical element.

15. The method of claim 14, wherein the device further comprises a bearing pin having a first diameter, and displacing the at least one contact point to position the optical element comprises exchanging the bearing pin having the first diameter with a bearing pin having a second diameter which is different from the first diameter.

16. The device of claim 1, further comprising coupling elements by which a force can be applied to the contact points.

17. The device of claim 16, wherein the coupling elements comprise clamping units that mechanically couple each of the three connecting pins to its corresponding bearing pin pair.

18. The device of claim 1, wherein at least one bearing pin has a diameter which is different from a diameter of at least one other bearing pin.

19. The device of claim 1, wherein each of the three connecting pins has a curved surface which contacts a curved bearing surface of the first bearing pin in its bearing pin pair and which contacts a curved bearing surface of the second bearing pin in its bearing pin pair.

20. The device of claim 1, wherein the device is configured so that replacing a given bearing pin with a first diameter with a bearing pin having a different diameter changes an orientation the optical element relative to the holding structure.

21. A device, comprising:
    an optical element including three connecting elements projecting substantially in a radial direction;
    a holding structure comprising three bearing element pairs; and
    coupling elements,
    wherein:
        each connecting element has a corresponding coupling element and a corresponding bearing element pair;

for each connecting element, the corresponding coupling element applies a force to each bearing element of the corresponding bearing element pair so that each bearing element of the corresponding bearing element pair contacts the connecting element;

the holding structure and the coupling elements support the optical element; and for each bearing element pair, the bearing elements in the bearing element pair are:
  removably disposed within the holding structure, substantially orthogonal to each other; and
  displaced relative to each other in the radial direction.

22. The device of claim 21, wherein each of the three connecting elements has an oval cross-section.

23. The device of claim 21, wherein each of the three connecting elements has an elliptical cross-section.

24. The device of claim 21, wherein each of the three connecting elements has a circular cross section.

25. The device of claim 21, wherein, for each connecting element, a curved surface of each bearing element of the corresponding bearing element pair contacts the connecting element.

26. The device of claim 21, wherein there are a total of six contact points between the connecting elements and the bearing elements.

27. The device of claim 21, wherein, for each connecting element, the connecting element is substantially orthogonal to the bearing elements in its corresponding bearing element pair.

28. The device of claim 21, wherein the coupling elements comprise clamping units that mechanically couple each of the three connecting elements to its corresponding bearing element pair.

29. The device of claim 21, wherein the coupling elements comprise force-generating elements.

30. The device of claim 21, wherein each connecting element is a connecting pin.

31. The device of claim 21, wherein each bearing element is a bearing pin.

32. The device of claim 21, wherein, for each connecting element, a curved surface of each bearing element of the corresponding bearing element pair contacts a curved surface of the connecting element at a contact point.

33. The device of claim 21, wherein at least one bearing element has a diameter which is different from a diameter of at least one other bearing element.

34. The device of claim 33, wherein for each connecting element the contact point is displaceable by exchanging at least one bearing element having a first diameter with another bearing element having a different diameter.

* * * * *

UNITED STATES PATENT AND TRADEMARK OFFICE
CERTIFICATE OF CORRECTION

| | |
|---|---|
| PATENT NO. | : 8,665,419 B2 |
| APPLICATION NO. | : 13/102496 |
| DATED | : March 4, 2014 |
| INVENTOR(S) | : Boaz Pnini-Mittler |

It is certified that error appears in the above-identified patent and that said Letters Patent is hereby corrected as shown below:

In the Claims

Col. 6, line 58, in Claim 20, delete "the optical" and insert -- of the optical --.

Signed and Sealed this
Third Day of June, 2014

Michelle K. Lee
*Deputy Director of the United States Patent and Trademark Office*